US008823359B2

(12) United States Patent
Zhang et al.

(10) Patent No.: US 8,823,359 B2
(45) Date of Patent: Sep. 2, 2014

(54) THREE-PHASE ELECTRIC ENERGY MEASUREMENT APPARATUS

(75) Inventors: Zhigao Zhang, Beijing (CN); Zhishou Zheng, Beijing (CN); Qingchang Qu, Beijing (CN)

(73) Assignee: National Institute of Metrology P.R. China, Beijing (CN)

( * ) Notice: Subject to any disclaimer, the term of this patent is extended or adjusted under 35 U.S.C. 154(b) by 306 days.

(21) Appl. No.: 13/143,318

(22) PCT Filed: Dec. 11, 2009

(86) PCT No.: PCT/CN2009/001429
§ 371 (c)(1),
(2), (4) Date: Jul. 5, 2011

(87) PCT Pub. No.: WO2010/081280
PCT Pub. Date: Jul. 22, 2010

(65) Prior Publication Data
US 2011/0267032 A1    Nov. 3, 2011

(30) Foreign Application Priority Data
Jan. 13, 2009  (CN) .......................... 2009 1 0000667

(51) Int. Cl.
*G01R 19/00*  (2006.01)
*G01R 21/133*  (2006.01)
*G01R 15/14*  (2006.01)
*G01R 21/06*  (2006.01)

(52) U.S. Cl.
CPC ............ *G01R 21/133* (2013.01); *G01R 15/142* (2013.01); *G01R 21/06* (2013.01)
USPC ............... 324/107; 324/74; 324/86; 324/134; 324/142

(58) Field of Classification Search
USPC ............... 324/74, 86, 107, 134, 142
See application file for complete search history.

(56) References Cited

U.S. PATENT DOCUMENTS 2,443,097 A * 6/1948 Crosby ......................... 324/95
3,999,117 A * 12/1976 Gyugyi et al. ................ 323/211
(Continued)

FOREIGN PATENT DOCUMENTS

CN        2415366 Y      1/2001
CN        2427812 Y      4/2001
(Continued)

OTHER PUBLICATIONS

International Search Report from the State Intellectual Property Office of P.R. China for International Application No. PCT/CN2009/001429, Mailed Feb. 11, 2010.

(Continued)

*Primary Examiner* — Huy Q Phan
*Assistant Examiner* — Temilade S Rhodes-Vivour
(74) *Attorney, Agent, or Firm* — Finnegan, Henderson, Farabow, Garrett & Dunner, L.L.P.

(57) ABSTRACT

This disclosure relates to a three-phase electric energy measurement apparatus, comprising: a voltage detection unit for detecting voltage of each phase in power transmitting lines where the voltage detection unit is; a current detection unit for detecting current of each phase in the power transmitting lines where the current detection unit is; an electric energy calculation unit, connected to said voltage detection unit and said current detection unit, for receiving signals outputted from said voltage detection unit and said current detection unit, and performing signal processing and calculation, and then outputting a calculation result; wherein both said voltage detection unit and said electric energy calculation unit are connected in a star connection mode, forming a common virtual ground. Through the above-mentioned grounding manner different from that in the prior art, a three-phase four-wire electric energy meter is formed using a three-phase three-wire connection method. As a result, devices required by the three-phase electric energy measurement apparatus are saved, thereby reducing manufacture costs, and meanwhile, measurement errors due to asymmetrical loads of three phases are eliminated, thereby improving the measurement accuracy. Besides this, detection of single-phase current and single-phase voltage can be realized.

13 Claims, 5 Drawing Sheets

(56) References Cited

U.S. PATENT DOCUMENTS

| | | | |
|---|---|---|---|
| 4,924,412 A * | 5/1990 | Leydier | 702/64 |
| 5,159,246 A * | 10/1992 | Ueki | 318/400.06 |
| 5,485,393 A * | 1/1996 | Bradford | 702/60 |
| 5,497,077 A * | 3/1996 | Nukui | 324/117 H |
| 5,757,637 A * | 5/1998 | Tuck et al. | 363/125 |
| 8,027,180 B2 * | 9/2011 | Nakagawa | 363/98 |
| 2009/0102438 A1 * | 4/2009 | Raedy et al. | 323/258 |

FOREIGN PATENT DOCUMENTS

| | | |
|---|---|---|
| CN | 1808151 A | 7/2006 |
| CN | 201011520 Y | 1/2008 |
| CN | 201141892 Y | 10/2008 |
| CN | 101458277 A | 6/2009 |
| GB | 301398 | 2/1930 |
| GB | 672045 | 5/1952 |
| WO | WO 99/44071 | 9/1999 |

OTHER PUBLICATIONS

Patent Examination Report No. 1, issued by Australian Patent Office, mailed Apr. 24, 2013, in Australian Patent Application No. 2009337631 (2 pages).

Notification of the First Office Action, issued by State Intellectual Property Office of the People's Republic of China, dated Mar. 30, 2010, in Chinese application No. 200910000667.0 (15 pages including translation).

* cited by examiner

THREE-PHASE ELECTRIC ENERGY MEASUREMENT APPARATUS

CROSS REFERENCE TO RELATED APPLICATIONS

This application is a National Phase Application of International Application No. PCT/CN2009/001429, filed Dec. 11, 2009, and claims the benefit of priority of Chinese Patent App. No. 200910000667.0 filed Jan. 13, 2009, the contents of both of which are incorporated herein by reference in their entirety.

TECHNICAL FIELD

This disclosure relates generally to a filed of measuring the electric power, and in particular to a three-phase electric energy measurement apparatus.

DESCRIPTION OF THE RELATED ART

Electric energy is the nerve of the state energy system, and the electric energy industry occupies above 10% of the gross domestic product GDP. As energy-saving and emission reduction and resource conservation draw more and more attention from the countries all over the world, with the reform of the electric power industry system, the significance of accurate electric energy measurement is showed distinctly, and in particular the high-voltage electric energy measurement is the key for constructing the national energy measurement system. More than 85% of the electric energy settlement is high-voltage portions between power plants and power grids, between the power grids and power supply enterprises, and between the power supply enterprises and power consumption enterprises. Accordingly, the accurate high-voltage electric energy measurement will become the most important challenge and opportunity for electric energy metering.

At present, the conventional low-voltage 380V/22V three-phase electric energy measurement (metering) apparatuses are classified into two types: one type includes three-phase four-wire system electric energy meters, and the other includes three-phase three-wire system electric energy meters. The principle of the typical three-phase four-wire system electric energy meter is as shown in FIG. 1. It actually consists of three electric energy metering devices $W_1$, $W_2$, and $W_3$ that are disposed between three phases A, B and C and a ground wire N, respectively, for measuring the amount of electricity consumed of the three phases, respectively. This three-phase four-wire system electric energy meter attains an accurate measuring result, but it is necessary to introduce a ground wire (i.e., a neutral wire) of a power grid, resulting in a complicated measurement structure.

The three-phase three-wire system electric energy meter of the other type has a schematic diagram as shown in FIG. 2. This three-phase three-wire electric energy meter measures electric energy of three phases with only two electric energy metrology devices $W_1$ and $W_2$ required. Voltage branches of the devices $W_1$ and $W_2$ are connected across phases A-B and across C-B, respectively, so that the structure and wiring of the three-phase three-wire electric energy meter are simpler than those of the three-phase four-wire electric energy meter. It is an important simplification of the three-phase four-wire electric energy meter, but its basic condition is that the loads of three phases are absolutely symmetrical (that is, the sum of currents of three phases is equal to zero). This condition cannot be satisfied in many cases, and if the currents of three phases are asymmetrical, a principle error will be introduced.

These two low-voltage electric energy measurement apparatuses are disadvantageous of low measurement accuracy. In order to achieve high measurement accuracy, there appears in the prior art a low-voltage electric energy measurement apparatus as shown in FIG. 3, wherein line currents in three phases A, B and C are measured by current/voltage converters (I/V 1, I/V 2, I/V 3) each being connected in series in their respective lines, respectively, three line voltages are measured by voltage/voltage converters (V/V 4, V/V 5, V/V 6) each being connected across every two phases, respectively, and then line voltage signals of three-way and line current signals of the three-way are simultaneously applied to an electric energy calculation unit (M7) to perform high-voltage electric energy measurement. FIG. 4 shows an electric energy measurement apparatus, similar to that shown in FIG. 3, which is applicable in a high-voltage environment. These two electric energy measurement apparatuses, which do not require the loads of three phases to be as critically symmetrical as those of the three-phase three-wire system electric energy meter, still require the loads of three phases to be as symmetrical as possible and otherwise errors will be introduced. Meanwhile, each of the voltage branches carries a voltage from two phases of the lines, which causes poor security, and these two electric energy measurement apparatuses have a complicated measurement mechanism and are manufactured with high costs, which is adverse to their popularization and application in electric energy measurement for high-voltage power grids.

SUMMARY

An object of this disclosure is to provide a three-phase electric energy measurement apparatus, which is capable of performing three-phase electric energy measurement with low costs and with low measurement errors.

In order to achieve the above-mentioned object, this disclosure provides a three-phase electric energy measurement apparatus, comprising:

voltage detection units each for detecting voltage of respective phase in transmitting lines;

current detection units each for detecting current of respective phase in the transmitting lines;

an electric energy calculation unit, connected to said voltage detection units and said current detection units, for receiving signals outputted from said voltage detection units and said current detection units, and performing signal processing and calculation, and then outputting a calculation result;

wherein said voltage detection units and said electric energy calculation unit are connected in a star connection mode, thereby forming a common virtual ground.

In the foregoing technical solution, said voltage detection units and said electric energy calculation unit are connected in a star connection mode, thereby forming a common virtual ground, and through this grounding manner, a three-phase four-wire electric energy meter is formed using a three-phase three-wire connection method. As a result, devices required by the three-phase electric energy measurement apparatus are saved, thereby reducing manufacture costs, and meanwhile, measurement errors due to asymmetrical loads of three phases are eliminated, thereby improving the measurement accuracy.

Further, said voltage detection units include:

an A-phase voltage detection unit for detecting voltage of phase A in the transmitting lines;

a B-phase voltage detection unit for detecting voltage of phase B in the transmitting lines; and a C-phase voltage detection unit for detecting voltage of phase C in the transmitting lines;

said current detection units include:

an A-phase current detection unit for detecting current of phase A in the transmitting lines;

a B-phase current detection unit for detecting current of phase B in the transmitting lines; and a C-phase current detection unit for detecting current of phase C in the transmitting lines.

Further, the voltage detection unit for each phase is a voltage/voltage converter.

Further, said voltage/voltage converter consists of a divider resistance unit and a current/voltage converter connected in series.

Further, in order to improve the safety in high-voltage electric energy measurement, said divider resistance unit consists of a plurality of voltage-division resistors connected in series.

Further, in order to improve the system's anti-interference ability, said voltage-division resistors are externally surrounded with an equipotential shielding structure.

Further, said equipotential shielding structure consists of a conductive ring composed of a plurality of capacitors connected in series.

Further, there is also comprised a wireless transmission unit for wirelessly transmitting a result outputted from the electric energy calculation unit to a low-voltage area or a work area.

Further, in order to solve the power supply problem for the electric energy calculation unit, the respective detection units and wireless transmission unit under high voltage, an output terminal of said conductive ring is connected to an energy conversion unit for converting current outputted from said conductive ring into a DC power source and outputting it to said electric energy calculation unit and said wireless transmission unit as a power source therefor.

Further, the current detection unit for each phase is a current/voltage converter connected in series to respective phase transmitting line.

Further, said current/voltage converter consists of a current transformer and a resistor.

Further, said electric energy calculation unit includes:

an analog/digital conversion module for converting analog quantities inputted by the current detection unit for each phase and the voltage detection unit for each phase into the corresponding digital quantities;

a power calculation module for calculating a power in accordance with the digital quantities corresponding to the current detection unit for each phase and the voltage detection unit for each phase;

a digital/frequency conversion module for converting the calculated power into a pulse signal at a corresponding frequency;

an electric energy accumulation module for accumulating said pulse signals to obtain an electric energy value;

an output module for outputting, to the wireless transmission unit, at least one of the detected current, the detected voltage, the electric energy value, the power, an alarm signal and a protection signal.

On the basis of the technical solution described above, the three-phase electric energy measurement apparatus provided according to this disclosure has a simple structure, takes low costs, and performs accurate measurement, and it is not only applicable to low-voltage electric energy measurement (with a line voltage less than 400V), but also applicable to high-voltage electric energy measurement (with a line voltage of 10 kV or more) and the corresponding power grid measurement and control.

BRIEF DESCRIPTION OF THE ACCOMPANYING DRAWINGS

The drawings referred to below are used to provide further understanding of this disclosure and constitute a portion of the present application. The schematic embodiments of this disclosure and the descriptions thereof are used to construe this disclosure and do not constitute improper limitations over this disclosure. In the drawings, FIG. 1 is a structure schematic view of a three-phase four-wire system electric energy meter in the prior art;

DETAILED DESCRIPTION OF THE PREFERRED EMBODIMENT

A detailed description of the technical solution of this disclosure is further given below with reference to the drawings and embodiments.

Figure 5:
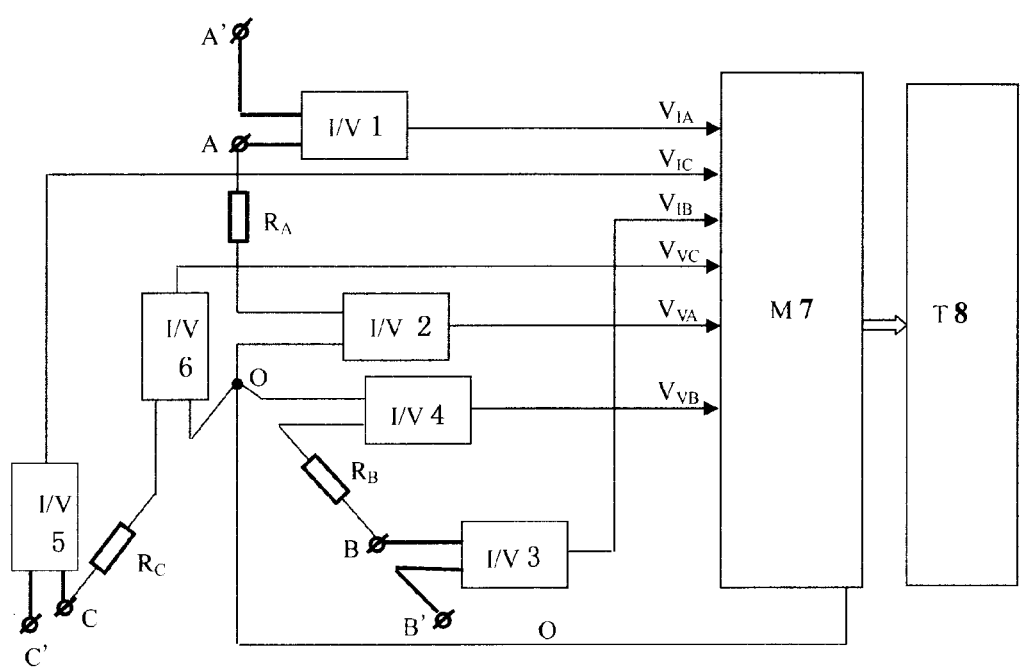
FIG. 5 is a structure schematic view showing an embodiment of a three-phase electric energy measurement apparatus of the present application which is applicable to low voltage.

As shown in FIG. 5, it is a structure schematic view showing an embodiment of a three-phase electric energy measurement apparatus of the present application which is applicable to low voltage. The electric energy measurement apparatus comprises essentially the following parts: current detection units, voltage detection units, and an electric energy calculation unit.

The current detection units include an A-phase current detection unit, a B-phase current detection unit, and a C-phase current detection unit. The A-phase current detection unit, connected to a phase line AA' of transmitting lines in series, for measuring current of the phase line AA', and the A-phase current detection unit may be a current/voltage converter I/V1 which may either be a current transformer or be formed using the current transformer plus a resistor. The B-phase current detection unit, connected to a phase line BB' of the transmitting lines in series, for measuring current of the phase line BB', and the B-phase current detection unit may be a current/voltage converter I/V3 which may either be a current transformer or be formed using the current transformer plus a resistor. The C-phase current detection unit, connected to a phase line CC' of the transmitting lines in series, for measuring current of the phase line CC', and the C-phase current detection unit may be a current/voltage converter I/V5 which may either be a current transformer or be formed using the current transformer plus a resistor.

The voltage detection units include an A-phase voltage detection unit, a B-phase voltage detection unit, and a C-phase voltage detection unit. The A-phase voltage detection unit, connected to the phase line AA' of the transmitting lines in parallel, for measuring voltage of the phase line AA', and the A-phase voltage detection unit is a voltage/voltage conversion means which may either be formed by a resistor $R_A$ and a current/voltage converter I/V2 connected in series or be a voltage transformer. The B-phase voltage detection unit, connected to the phase line BB' of the transmitting lines in parallel, for measuring voltage of the phase line BB', and the B-phase voltage detection unit is a voltage/voltage conversion means which may either be formed by a resistor $R_B$ and a current/voltage converter I/V4 connected in series or be a voltage transformer. The C-phase voltage detection unit, connected to the phase line CC' of the transmitting lines in parallel, for measuring voltage of the phase line CC', and the C-phase voltage detection unit is a voltage/voltage conversion means which may either be formed by a resistor $R_C$ and a current/voltage converter I/V6 connected in series or be a voltage transformer.

Analog signals outputted from the above-mentioned six current/voltage converters I/V are inputted to an electric energy calculation unit 7 and used, after being subjected to A/D conversion, for calculation of electric energy, wherein the current/voltage converter I/V2, the current/voltage converter I/V4, the current/voltage converter I/V6, and the electric energy calculation unit M7 have a common ground. The ground wires of the current/voltage converter I/V2, the current/voltage converter I/V4, and the current/voltage converter I/V6 are not actually grounded, but the ground wires of the three are connected to form a virtual ground or floating ground "O", and the ground of the electric energy calculation unit M7, which is not really grounded, is the virtual ground or the floating ground "O", the grounding shape described above presenting a "star shape". Through the above-mentioned grounding manner different from that in the prior art, a three-phase four-wire electric energy meter is formed using a three-phase three-wire connection method. As a result, devices required by the three-phase electric energy measurement apparatus are saved, thereby reducing manufacture costs, and meanwhile, measurement errors due to asymmetrical loads of three phases are eliminated, thereby improving the measurement accuracy. Besides this, detection of single-phase current and single-phase voltage can be realized.

By using a transformer structure, the current/voltage converter I/V2, the current/voltage converter I/V4, and the current/voltage converter I/V6 can realize good electrical insulation between primary and secondary.

In the embodiment, the electric energy calculation unit M7 includes the following modules: an A/D conversion module which converts analog quantities into the corresponding digital quantities; a power calculation module which calculates a power in accordance with digital quantities corresponding to the current detection unit for each phase and the voltage detection unit for each phase; a digital to frequency conversion module which converts the calculated power into a pulse signal at a corresponding frequency; an electric energy accumulation module which accumulates said pulse signals to obtain an electric energy value, wherein the calculation of the electric energy value will be specifically explained in the following; and an output module which outputs at least one of said current, said voltage, said electric energy value, said power, and an alarm signal.

In the embodiment, it is possible to further provide a wireless transmission unit T8 which transmits wirelessly an output result of the electric energy calculation unit to a low voltage area or work area.

Figure 6:
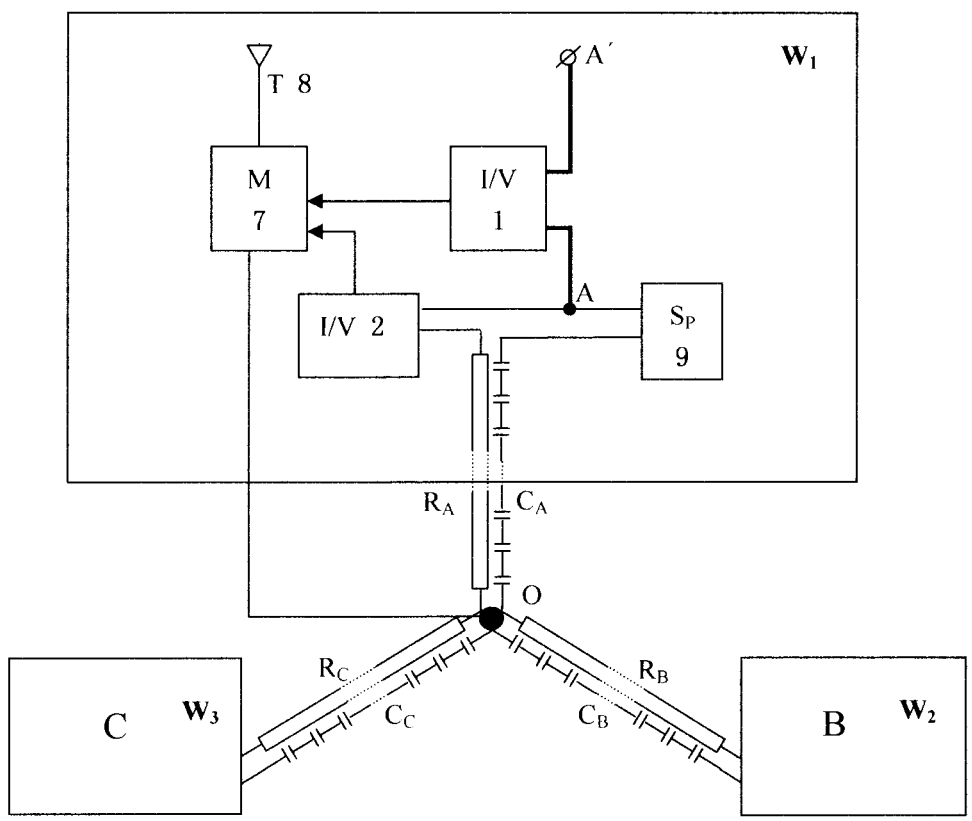
FIG. 6 is a structure schematic view showing an embodiment of the three-phase electric energy measurement apparatus of the present application which is applicable to high voltage.

As shown in FIG. 6, it is a structure schematic view of an embodiment of the three-phase electric energy measurement apparatus of this disclosure which is applicable to high voltage. In this embodiment, the current detection units, the voltage detection units, the electric energy calculation unit, and the wireless transmission unit and their mutual connection manners are basically the same as those in the foregoing first embodiment, and details thereof are omitted here.

In the present embodiment, the A-phase current detection unit and the A-phase voltage detection unit function as a measurement unit $W_1$, the B-phase current detection unit and the B-phase voltage detection unit function as a measurement unit $W_2$, and the C-phase current detection unit and the C-phase voltage detection unit function as a measurement unit $W_3$, and the three measurement units select three ports A, B and C as a reference point of high voltage, respectively, and meanwhile, the measurement units $W_1$, $W_2$ and $W_3$ are all disposed within an electricity and heat screening structure so as to ensure security and stability of the instant stage.

In order to ensure absolute safety of voltage and power consumption of each voltage-division resistor, resistor $R_A$ is a divider resistance unit A consisting of a plurality of voltage-division resistors connected in series, resistor $R_B$ is a divider resistance unit B consisting of a plurality of voltage-division resistors connected in series, and resistor $R_C$ is a divider resistance unit C consisting of a plurality of voltage-division resistors connected in series.

In addition, in order to ensure accuracy and anti-interference of the electric energy measurement apparatus according to the embodiment, each of said divider resistance units is externally surrounded with a Warner branch which is formed by a conductive ring consisting of a plurality of capacitors connected in series, thereby forming a squirrel-cage equipotential shielding structure. The current (typically 2 mA) of each capacitor in said Warner branch, which is collected and processed by the corresponding energy conversion units $S_{PA}$, $S_{PB}$ and $S_{PC}$, provide the electric energy calculation unit M7 and the wireless transmission unit T8 with a DC power source, and of course, the electric energy calculation unit M7 and the wireless transmission unit T8 can also be supplied with power via other external power supplies.

The energy conversion unit can be either integrated $S_p$ 9 or discrete $S_{PA}$, $S_{PB}$ and $S_{PC}$. The electric energy calculation unit M7 can be either integrated or discrete. The wireless transmission unit T8 can be either integrated or discrete. The signal outputted from the electric energy calculation unit M7 can be transmitted by the wireless transmission unit T8 to the low voltage area or work area, and a receiving system in the low voltage area or work area receives the signal and further performs data processing. The result transmitted by the wireless transmission unit T8 is not limited to electric energy, but may further include current, voltage, power, an alarm signal, and a protection signal, etc.

Therefore, this embodiment can be applied to electric energy measurement in high-voltage lines in a better way, and for example, it can be applied to a high-voltage (e.g., 10 kV, 20 kV, 35 kV) electric energy metering cabinet, or applied to manufacture of a three-phase high-voltage electric energy meter for a power grid high voltage (e.g., 110 kV, 220 kV and more).

Figure 1:
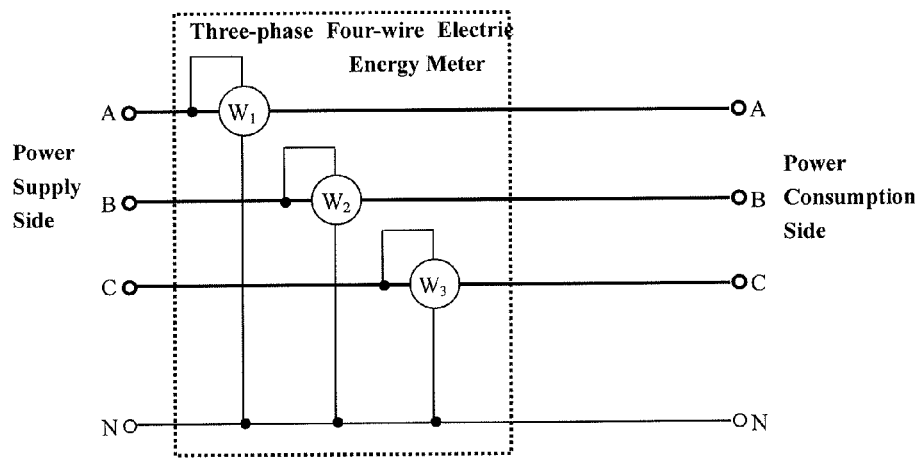
Figure 2:
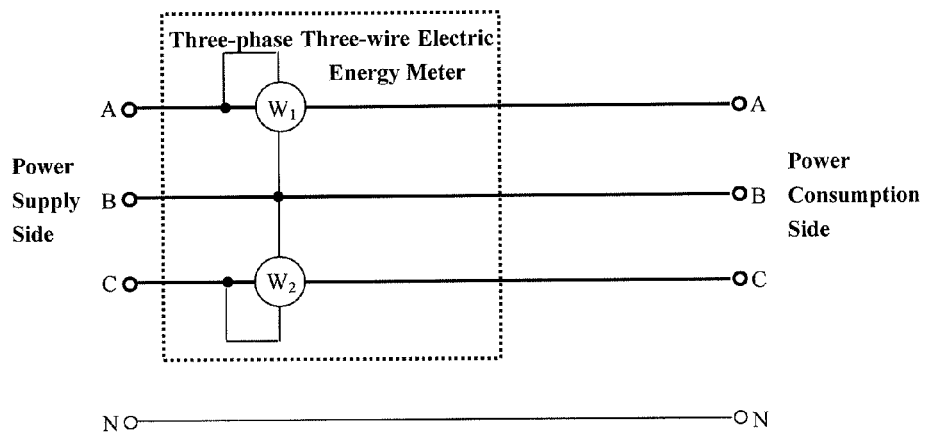
FIG. 2 is a structure schematic view of a three-phase three-wire system electric energy meter in the prior art.
Figure 3:
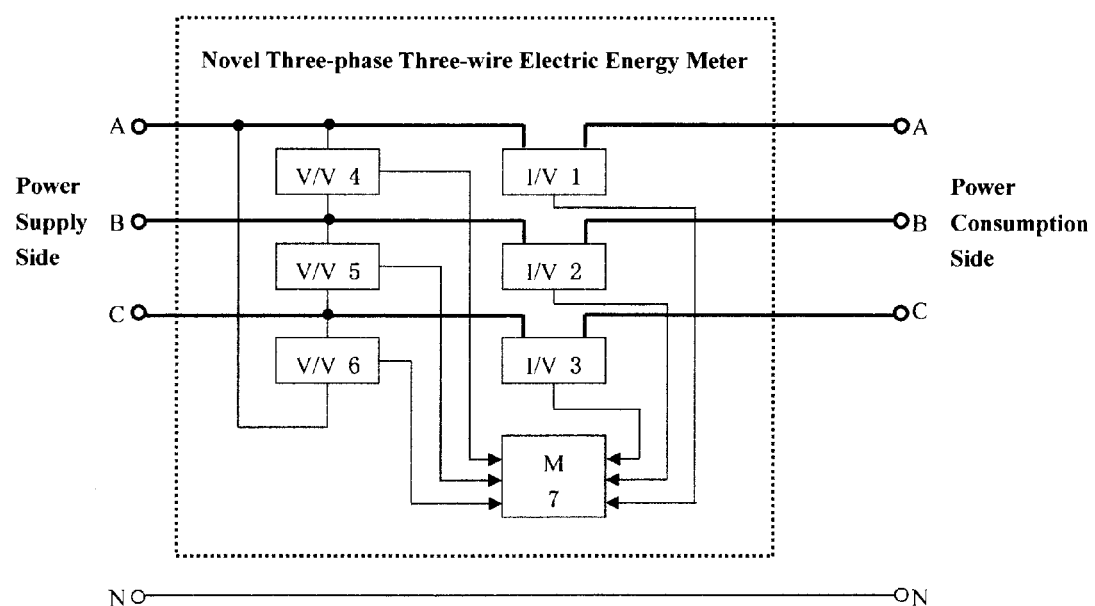
FIG. 3 is a structure schematic view of another three-phase three-wire electric energy meter in the prior art.
Figure 4:
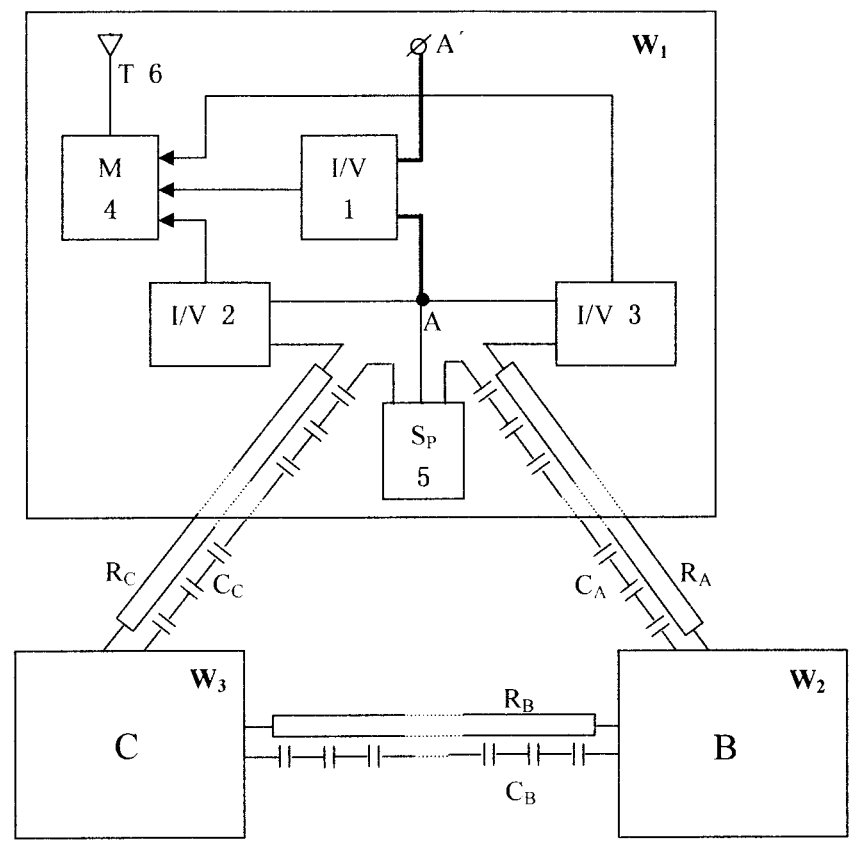
FIG. 4 is a structure schematic view of another high-voltage three-phase electric energy meter in the prior art.

In order to further explain the differences of the electric energy measurement apparatus of this disclosure from that of the prior art, a further description of this disclosure is given below based on the principle of this disclosure. The principle of the three-phase electric energy measurement apparatus of this disclosure is not only different from that of the three-phase four-wire system electric energy meter in the prior art as shown in FIG. 1, but also different from those of the another three-phase electric energy meter and three-phase high-voltage electric energy meter in the prior art as shown in FIG. 3 and FIG. 4. Its fundamental principle is analyzed as follows:

A mathematical expression of the three-phase electric energy meter for three-phase four-wire system is:

$$P_\Sigma = \frac{1}{T}\int u_A i_A \, dt + \frac{1}{T}\int u_B i_B \, dt + \frac{1}{T}\int u_C i_C \, dt. \quad (1)$$

A mathematical expression of an electric energy measurement result of the three-phase electric energy measurement apparatus in this disclosure is:

$$P'_\Sigma = \frac{1}{T}\int (u_A - u_O)i_A \, dt + \frac{1}{T}\int (u_B - u_O)i_B \, dt + \frac{1}{T}\int (u_C - u_O)i_C \, dt, \quad (2)$$

or $$P'_\Sigma = P_\Sigma - \frac{1}{T}\int u_O(i_A + i_B + i_C)\, dt. \quad (3)$$

The final term in the expression (3) is an error of the measurement result of the three-phase electric energy measurement apparatus in this disclosure.

In accordance with the current continuity principle (the Kirchhoff's Laws), $$\frac{u_O - u_A}{R_A} + \frac{u_O - u_B}{R_B} = \frac{u_C - u_O}{R_C}, \quad (4)$$

when $R_A = R_B = R_C$, $$u_0 = \frac{1}{3}(u_A + u_B + u_C)$$

is substituted into the expression (3) to obtain $$P'_\Sigma = P_\Sigma - \frac{1}{T}\int \frac{1}{3}(u_A + u_B + u_C)(i_A + i_B + i_C)\, dt \quad (5)$$

$$P_\Sigma = P'_\Sigma + \frac{1}{3}\frac{1}{T}\int \Delta u \Delta i \, dt.$$

In the above expressions, P is power; $P_\Sigma$ is the sum of powers of three phases; T is time; $u_A$ is a phase voltage of phase A; $u_B$ is a phase voltage of phase B; $u_C$ is a phase voltage of phase C; $i_A$ is a phase current of phase A; $i_B$ is a phase current of phase B; $i_C$ is a phase current of phase C; $u_O$ is a voltage of the virtual ground; $R_A$ is a divider resistance unit (or voltage-division resistors) of phase A; $R_B$ is a divider resistance unit (or voltage-division resistors) of phase B; $R_C$ is a divider resistance unit (or voltage-division resistors) of phase C; $\Delta u$ is the sum of voltage vectors of three phases; $\Delta i$ is the sum of current vectors of three phases.

The final term in the expression (5) is a further derived result of the measurement error of the three-phase electric energy measurement apparatus. Considering that the voltages and currents of three phases are substantially symmetrical in the actual operation state, that is, the sum of the voltage vectors of three phases and the sum of the current vectors of three phases are minor terms close to zero, the product of these two minor terms is a second-ordered minor term and its numerical value is closer to zero, which can be neglected in the actual measurement.

Compared with the three measurement units $W_1$, $W_2$ and $W_3$ of the three-phase three-wire high-voltage electric energy meter in the prior art as shown in FIG. 4, which have two phases, the three measurement units $W_1$, $W_2$ and $W_3$ in the three-phase high-voltage electric energy measurement apparatus of the embodiment as shown in FIG. 6 have a single phase. Thus the complexity and cost of the measurement units in the electric energy measurement apparatus of this disclosure are reduced and its reliability is improved; the most important is that voltage branches of the latter carry a phase voltage, whereas voltage branches of the former carry a line voltage, the latter being lower than the former by $\sqrt{3}$ times in the same power grid (for the specific differences therebetween, see Table 1). As a sequence, the security of the latter is greatly improved and its manufacture costs are significantly reduced. And furthermore, the voltages and currents of three phases are substantially symmetrical in the actual operation state, that is, the sum of the voltage vectors of three phases and the sum of the current vectors of three phases are minor terms close to zero, without being influenced by the asymmetry of the loads. Accordingly, the latter has better popularization and application value and prospects. A comparison of both is made using specific numbers in the table given below.

TABLE 1

Comparison between Voltages Carried by Voltage Branches of Two High-voltage Electric Energy Apparatuses

| | Applied Power Grid Voltage (kV) | | | | | |
|---|---|---|---|---|---|---|
| | 10 | 20 | 35 | 110 | 220 | 500 |
| Three-phase High-voltage Electric Energy Meter shown in FIG. 4 | 10 | 20 | 35 | 110 | 220 | 500 |
| Three-phase High-voltage Electric Energy Meter shown in FIG. 6 | 5.8 | 11.6 | 20.2 | 63.5 | 127 | 289 |

At last, it should be noted that the embodiments described below are only used to set forth the technical solution of this disclosure rather than limit it; although this disclosure is described in detail with reference to the preferred embodiment, a person skilled in the art should understand that it is possible to modify the embodiments of this disclosure or perform equivalence substitution of part of the technical features thereof; without departing from the spirit of the technical solution of this disclosure, the embodiments should be embodied in the scope of the technical solution of this disclosure.

What is claimed is:

1. A three-phase electric energy measurement apparatus, comprising:
   voltage detection units each to detect a voltage of a respective phase line of transmitting lines;
   current detection units each to detect a current of a respective phase line of the transmitting lines;
   an electric energy calculation unit, connected to the voltage detection units and the current detection units, to receive signals outputted from the voltage detection units and the current detection units, and to perform signal processing and calculation, and to output a calculation result;

wherein the voltage detection units and the electric energy calculation unit are connected in a star connection mode, where ground wires of the voltage detection units and a ground wire of the electric energy calculatipn unit are connected to create a common virtual ground without being actually grounded.

2. The three-phase electric energy measurement apparatus according to claim 1, wherein the transmitting lines include an A-phase line, a B-phase line, and a C-phase line;
the voltage detection units including:
an A-phase voltage detection unit to detect a voltage of the A-phase line;
a B-phase voltage detection unit to detect a voltage of the B-phase line; and
a C-phase voltage detection unit to detect a voltage of the C-phase line; and
the current detection units including:
an A-phase current detection unit to detect a current of the A-phase line;
a B-phase current detection unit to detect a current of the B-phase line; and
a C-phase current detection unit to detect a current of the C-phase line.

3. The three-phase electric energy measurement apparatus according to claim 2, wherein the A-phase, B-phase, and C-phase voltage detection units are voltage/voltage converters.

4. The three-phase electric energy measurement apparatus according to claim 3, wherein each of the voltage/voltage converters includes a divider resistance unit and a current/voltage converter connected in series.

5. The three-phase electric energy measurement apparatus according to claim 4, wherein the divider resistance unit includes a plurality of voltage-division resistors connected in series.

6. The three-phase electric energy measurement apparatus according to claim 5, further comprising an equipotential shielding structure surrounding the voltage-division resistors.

7. The three-phase electric energy measurement apparatus according to claim 6, wherein the equipotential shielding structure includes a conductive ring comprising a plurality of capacitors connected in series.

8. The three-phase electric energy measurement apparatus according to claim 1, further comprising a wireless transmission unit to wirelessly transmit a result outputted from the electric energy calculation unit to a low-voltage area or a work area.

9. The three-phase electric energy measurement apparatus according to claim 7, further comprising a wireless transmission unit to wirelessly transmit a result outputted from the electric energy calculation unit to a low-voltage area or a work area.

10. The three-phase electric energy measurement apparatus according to claim 9, further comprising an energy conversion unit, connected to an output terminal of the conductive ring, to convert a current outputted from the conductive ring into a DC power and output the DC power to the electric energy calculation unit and the wireless transmission unit.

11. The three-phase electric energy measurement apparatus according to claim 10, wherein the A-phase, B-phase, and C-phase current detection units are current/voltage converters and are connected in series to the A-phase, B-phase, and C-phase transmitting lines, respectively.

12. The three-phase electric energy measurement apparatus according to claim 11, wherein each of the current/voltage converters includes a current transformer and a resistor.

13. The three-phase electric energy measurement apparatus according to claim 12, wherein the electric energy calculation unit includes:
an analog/digital conversion module to convert analog quantities outputted from the current detection units and the voltage detection units into corresponding digital quantities, wherein the analog quantities outputted from the current detection units include detected currents and the analog quantities outputted from the voltage detection units include detected voltages;
a power calculation module to calculate a power in accordance with the digital quantities corresponding to the current detection units and the voltage detection units;
a digital/frequency conversion module to convert the calculated power into a pulse signal at a corresponding frequency;
an electric energy accumulation module to accumulate the pulse signal to obtain an electric energy value;
an output module to output, to the wireless transmission unit, at least one of the detected currents, the detected voltages, the electric energy value, the power, an alarm signal and a protection signal.

* * * * *

UNITED STATES PATENT AND TRADEMARK OFFICE
CERTIFICATE OF CORRECTION

PATENT NO. : 8,823,359 B2
APPLICATION NO. : 13/143318
DATED : September 2, 2014
INVENTOR(S) : Zhigao Zhang et al.

It is certified that error appears in the above-identified patent and that said Letters Patent is hereby corrected as shown below:

On the Title page, col. 1, item 30, "2009 1 0000667" should read -- 200910000667 --.

In the Claims

Claim 1, col. 9, line 4, "calculatipn unit" should read -- calculation unit --.

Signed and Sealed this
Seventeenth Day of March, 2015

Michelle K. Lee
*Director of the United States Patent and Trademark Office*